(12) United States Patent
Anze

(10) Patent No.: US 10,256,073 B2
(45) Date of Patent: Apr. 9, 2019

(54) CHARGED PARTICLE BEAM WRITING METHOD

(71) Applicant: NuFlare Technology, Inc., Yokohama-shi (JP)

(72) Inventor: Hirohito Anze, Kamakura (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/897,645

(22) Filed: Feb. 15, 2018

(65) Prior Publication Data

US 2018/0233324 A1    Aug. 16, 2018

(30) Foreign Application Priority Data

Feb. 15, 2017 (JP) ................................. 2017-025738

(51) Int. Cl.
| | | |
|---|---|---|
| H01J 37/305 | (2006.01) | |
| G03F 7/20 | (2006.01) | |
| H01J 37/302 | (2006.01) | |
| H01L 21/027 | (2006.01) | |
| H01J 37/147 | (2006.01) | |
| H01J 37/317 | (2006.01) | |
| G21K 5/04 | (2006.01) | |

(52) U.S. Cl.
CPC ............ H01J 37/3026 (2013.01); G03F 7/20 (2013.01); G21K 5/04 (2013.01); H01J 37/147 (2013.01);
(Continued)

(58) Field of Classification Search
CPC .............. H01J 37/3026; H01J 37/3045; H01J 37/1472; H01J 37/3023; H01J 37/3175;
(Continued)

(56) References Cited

U.S. PATENT DOCUMENTS 5,733,708 A * 3/1998 Catanzaro ........... H01J 37/3045
250/492.3
6,635,393 B2 * 10/2003 Pierrat ...................... G03F 1/30
430/311

(Continued)

FOREIGN PATENT DOCUMENTS

| JP | 2001-13691 | 1/2001 |
|---|---|---|
| JP | 2007-188950 | 7/2007 |

(Continued)

*Primary Examiner* — David A Vanore
(74) *Attorney, Agent, or Firm* — Oblon, McClelland, Maier & Neustadt, L.L.P.

(57) ABSTRACT

In one embodiment, a charged particle beam writing method includes writing a first pattern statically in central part of a first substrate having Charge Dissipation Layer (CDL), calculating, based on a position of the written first pattern, a first correction coefficient, writing a second pattern statically applying with the first correction coefficient in central part of a second substrate having no CDL, calculating, based on a position of the written second pattern, a second correction coefficient, writing a third pattern continuously applying with the first correction coefficient in central part of a third substrate having CDL, calculating, based on a position of the written third pattern, a third correction coefficient, writing a fourth pattern statically applying with the first correction coefficient in wide range of a fourth substrate having CDL, and calculating, based on a position of the written fourth pattern, a fourth correction coefficient.

8 Claims, 6 Drawing Sheets

(52) U.S. Cl.
CPC ........ *H01J 37/305* (2013.01); *H01J 37/3174* (2013.01); *H01L 21/027* (2013.01)

(58) Field of Classification Search
CPC ... H01J 2237/30472; H01J 2237/31796; H01J 2237/004; B82Y 10/00; B82Y 40/00; G03F 1/30; G03F 1/36; G03F 1/50; G03F 7/70466; G06F 17/50
USPC ...... 250/492.22, 492.3, 252.1, 396 R, 491.1; 430/5, 22, 296, 311, 942
See application file for complete search history.

(56) References Cited

U.S. PATENT DOCUMENTS

| | | | |
|---|---|---|---|
| 7,754,353 B2 * | 7/2010 | Newns | G11B 9/02 427/131 |
| 9,424,372 B1 * | 8/2016 | Torunoglu | G06F 17/50 |
| 2009/0242787 A1 * | 10/2009 | Nakayamada | B82Y 10/00 250/396 R |
| 2011/0031387 A1 * | 2/2011 | Nakayamada | B82Y 10/00 250/252.1 |
| 2012/0007002 A1 * | 1/2012 | Nakayamada | B82Y 10/00 250/492.22 |
| 2015/0206709 A1 * | 7/2015 | Nakayamada | H01J 37/3045 250/491.1 |
| 2018/0090298 A1 * | 3/2018 | Nakayamada | H01J 37/06 |
| 2018/0090299 A1 * | 3/2018 | Nakayamada | H01J 37/3026 |

FOREIGN PATENT DOCUMENTS

| | | |
|---|---|---|
| JP | 2009-4601 | 1/2009 |
| JP | 2010-225729 | 10/2010 |
| JP | 2010-225811 | 10/2010 |
| JP | 4939076 | 5/2012 |

* cited by examiner

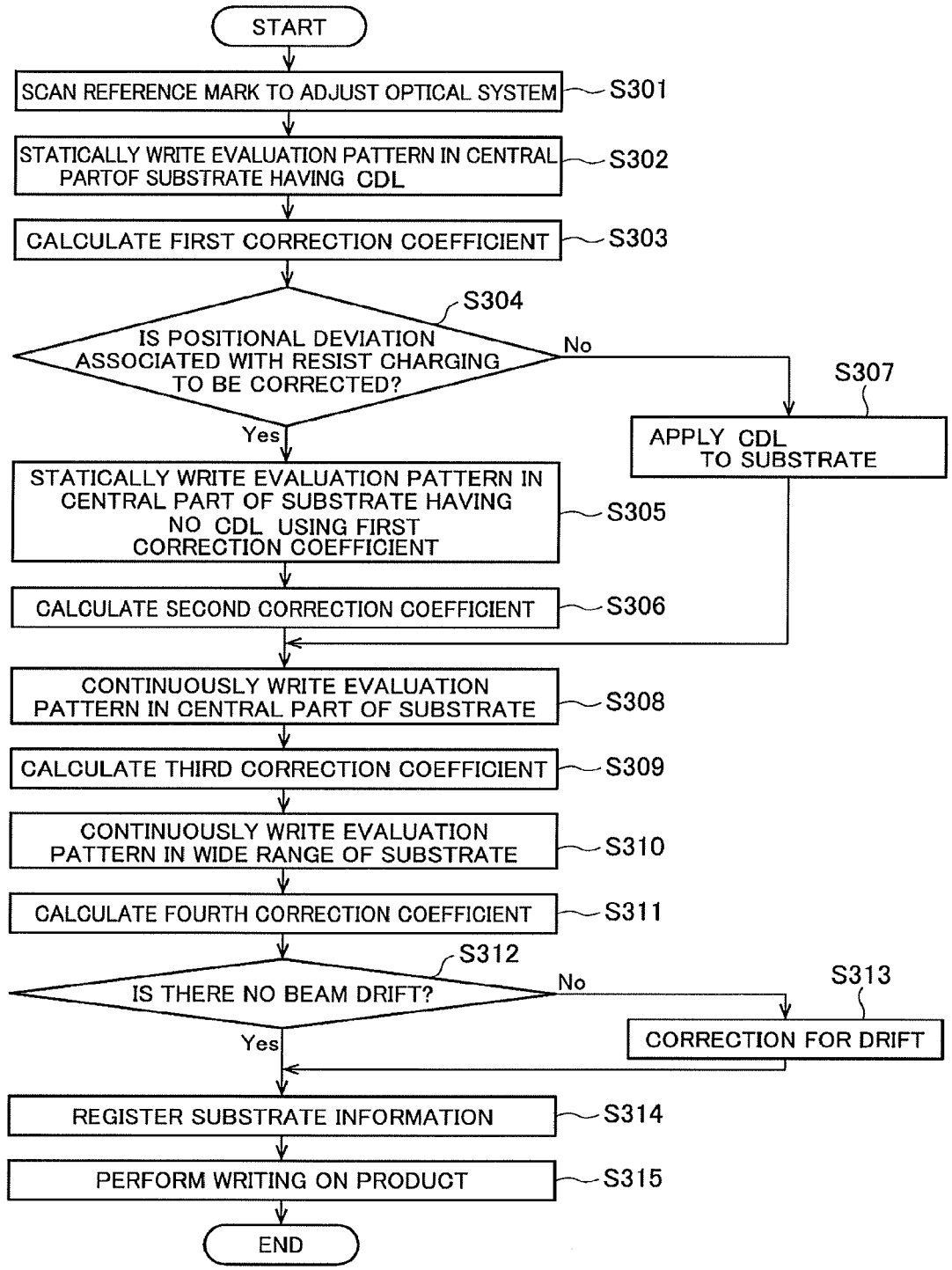

CHARGED PARTICLE BEAM WRITING METHOD

CROSS REFERENCE TO RELATED APPLICATION

This application is based upon and claims benefit of priority from the Japanese Patent Application No. 2017-25738, filed on Feb. 15, 2017, the entire contents of which are incorporated herein by reference.

FIELD

The present invention relates to a charged particle beam writing method.

BACKGROUND

With an increase in the packing density of LSIs, the required linewidths of circuits included in semiconductor devices become finer year by year. To form a desired circuit pattern on a semiconductor device, a method is employed in which a high-precision original pattern formed on quartz (i.e., a mask, or also particularly called reticle, which is used in a stepper or a scanner) is transferred to a wafer in a reduced manner by using a reduced-projection exposure apparatus. The high-precision original pattern is written by using an electron-beam writing apparatus, in which a so-called electron-beam lithography technique is employed.

In an electron beam writing apparatus, pattern-writing positional errors result from physical phenomena, such as substrate flexure, charging of resist applied to a substrate, and distortion in shape of an electron-beam deflection field. For this reason, correction coefficients for correcting the positional errors resulting from the physical phenomena are calculated and input to the writing apparatus.

In traditional writing position correction, for example, a correction coefficient for distortion in shape of an electron-beam deflection field is obtained in a state where physical phenomena, such as substrate flexure and resist charging, have occurred. In other words, the correction coefficient is determined such that the coefficient is affected by the physical phenomena other than the physical phenomenon associated with a positional error to be corrected. Disadvantageously, there is a limit to improvement in writing positional accuracy.

BRIEF DESCRIPTION OF THE DRAWINGS

FIG. 6 is a flowchart explaining a method of calculating correction coefficients in accordance with a third embodiment.

DETAILED DESCRIPTION

In one embodiment, a charged particle beam writing method is for writing a pattern on a substrate by irradiating the substrate with a charged particle beam. The substrate is placed on a movable stage and coated with resist. The method includes writing a first evaluation pattern in a writing area located in central part of a first substrate having a charge dissipation layer (CDL) on resist while stopping the stage to calculate, based on a position of the written first evaluation pattern, a first correction coefficient for correcting a positional error, correcting a writing position in a writing area located in central part of a second substrate having no CDL on resist using the first correction coefficient and writing a second evaluation pattern in the writing area of the second substrate while stopping the stage to calculate, based on a position of the written second evaluation pattern, a second correction coefficient for correcting a positional error, correcting a writing position in a writing area located in central part of a third substrate having CDL on resist using the first correction coefficient and writing a third evaluation pattern in the writing area of the third substrate while moving the stage to calculate, based on a position of the written third evaluation pattern, a third correction coefficient for correcting a positional error, correcting a writing position in a writing area larger than central part of a fourth substrate having CDL on resist using the first correction coefficient and writing a fourth evaluation pattern in the writing area of the fourth substrate while stopping the stage to calculate, based on a position of the written fourth evaluation pattern, a fourth correction coefficient for correcting a positional error, and computing a corrected position, at which positional deviation of the charged particle beam is corrected, on a surface of the substrate using the first, second, third, and fourth correction coefficients and irradiating the corrected position with the charged particle beam to write a predetermined pattern.

Hereinafter, an embodiment of the present invention will be described based on the drawings.

First Embodiment

Figure 1:
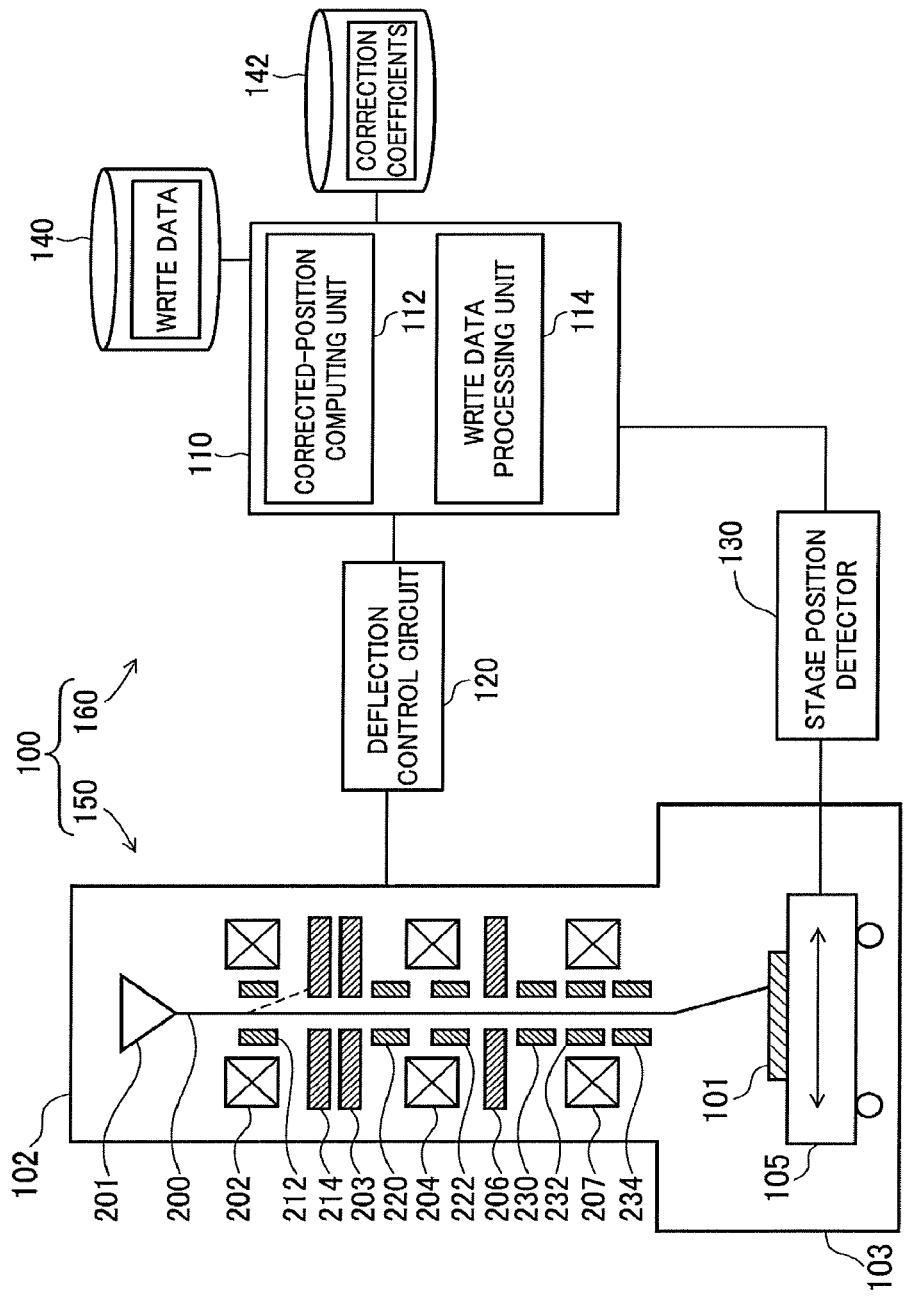
FIG. 1 is a schematic diagram of an electron beam writing apparatus according to a first embodiment of the present invention.

FIG. 1 is a schematic diagram of an electron beam writing apparatus according to a first embodiment of the present invention. The electron beam writing apparatus 100 illustrated in FIG. 1 is a variable-shaped writing apparatus and includes a writing unit 150 and a control unit 160.

The writing unit 150 includes an electron optical column 102 and a writing chamber 103. The electron optical column 102 accommodates an electron gun 201, an illumination lens 202, a blanker 212, a blanking aperture 214, a first shaping aperture 203, a projection lens 204, a first shaping deflector 220, a second shaping deflector 222, a second shaping aperture 206, an objective lens 207, a main deflector 232 (first objective deflector), a sub-deflector 230 (second objective deflector), and a sub-sub-deflector 234 (third objective deflector).

The first shaping deflector 220 and the second shaping deflector 222 each include eight pairs of (or sixteen) electrodes circumferentially spaced uniformly from one another. The deflectors are configured to deflect an electron beam when voltage is applied between the opposed electrodes.

The writing chamber 103 accommodates an XY stage 105. A substrate 101, serving as a writing target, is placed on the XY stage 105. The substrate 101 is, for example, a mask substrate fabricated by forming a metal light-shielding layer made of, for example, chromium, on a quartz substrate and coating the metal light-shielding layer with resist.

The control unit 160 includes a control computer 110, a deflection control circuit 120, a stage position detector 130, and memories 140 and 142, such as magnetic disk units.

The control computer 110 includes a corrected-position computing unit 112 and a write data processing unit 114. The corrected-position computing unit 112 and the write data processing unit 114 may be implemented by hardware or may be implemented by software.

The deflection control circuit 120 controls the amount of deflection by each of the blanker 212, the first shaping deflector 220, the second shaping deflector 222, the main deflector 232, the sub-deflector 230, and the sub-sub-deflector 234.

The stage position detector 130 includes a laser distance measuring device and detects the position of the XY stage 105.

The memory 140 (storage unit) stores write data (layout data), including a plurality of figure patterns, input from the outside. The memory 142 stores correction coefficients for correcting positional deviation of an electron beam 200 to be applied to the substrate 101. A method of calculating correction coefficients will be described later. A description of other control circuits for controlling an operation of the writing unit 150 is omitted.

When the electron beam 200, emitted from the electron gun 201 (emitting unit) disposed in the electron optical column 102, passes through the blanker 212 (blanking deflector), the electron beam 200 is controlled by the blanker 212 as follows. In a beam ON state, the electron beam 200 is controlled so as to pass through the blanking aperture 214. In a beam OFF state, the electron beam 200 is deflected such that the whole of the beam is interrupted by the blanking aperture 214. The electron beam 200 passed through the blanking aperture 214 for a period between the time when the beam is changed from the beam OFF state to the beam ON state and the time when the beam is changed to the beam OFF state corresponds to a one-time electron beam shot.

The blanker 212 controls the direction of the electron beam 200 passing therethrough to alternately generate the beam ON state and the beam OFF state. For example, a deflection voltage is not applied to the blanker 212 in the beam ON state, and the deflection voltage is applied to the blanker 212 in the beam OFF state. A dose per shot of the electron beam 200 to be applied to the substrate 101 is adjusted depending on irradiation time for each shot.

The electron beam 200 of each shot generated by allowing the beam to pass through the blanker 212 and the blanking aperture 214 is applied to the entire first shaping aperture 203 having a rectangular opening 32 (refer to FIG. 2) through the illumination lens 202. The electron beam 200 passes through the opening 32 of the first shaping aperture 203, so that the electron beam 200 is shaped into a rectangle.

The electron beam 200, serving as a first aperture image, passed through the first shaping aperture 203 is projected onto the second shaping aperture 206 having an opening 34 (refer to FIG. 2) through the projection lens 204. At this time, the first shaping deflector 220 and the second shaping deflector 222 perform deflection control on the first aperture image to be projected onto the second shaping aperture 206, so that the electron beam passing through the opening 34 can be changed in shape and dimension, or subjected to variable shaping.

The electron beam 200, serving as a second aperture image, passed through the opening 34 of the second shaping aperture 206 is focused by the objective lens 207. The electron beam 200 is deflected at three stages by the main deflector 232, the sub-deflector 230, and the sub-sub-deflector 234 and is then applied to a target position on the substrate 101 placed on the XY stage 105.

Figure 2:
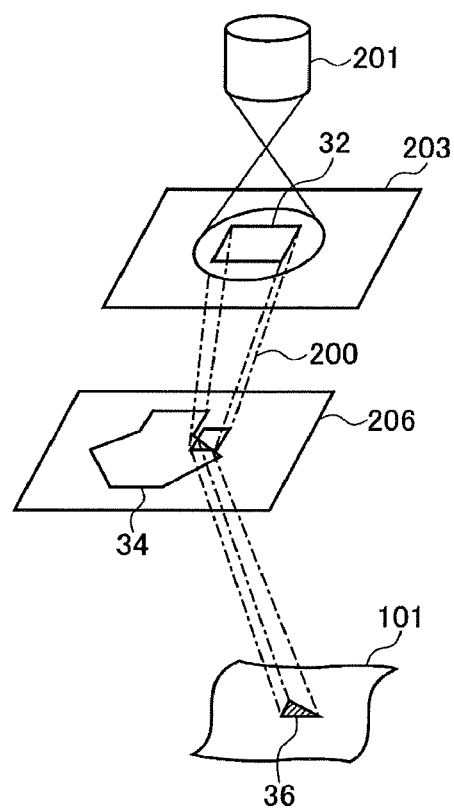
FIG. 2 is a schematic diagram explaining beam shaping.

FIG. 2 is a schematic perspective view explaining beam shaping by the first shaping aperture 203 and the second shaping aperture 206. The first shaping aperture 203 has the rectangular (rectangular or square) opening 32 for shaping the electron beam 200.

The second shaping aperture 206 has the variable-shaping opening 34 for shaping the electron beam 200 passed through the opening 32 of the first shaping aperture 203 into a desired shape. The variable-shaping opening 34 has an octagonal shape obtained by combining a hexagonal portion with a rectangular portion such that the rectangular portion connects to the hexagonal portion.

The electron beam 200 emitted from the electron gun 201 and passed through the opening 32 of the first shaping aperture 203 is deflected by the first shaping deflector 220 and the second shaping deflector 222. The electron beam 200 then passes through the variable-shaping opening 34, causing the electron beam to have a desired shape and dimensions. The electron beam, passed through part of the variable-shaping opening 34 of the second shaping aperture 206, having the desired shape and dimensions is applied to the substrate 101 placed on the XY stage 105 continuously moving in a predetermined direction (e.g., X direction). Specifically, the shape 36 of the beam allowed to pass through both the opening 32 of the first shaping aperture 203 and the variable-shaping opening 34 of the second shaping aperture 206 is written in a writing area of the substrate 101 placed on the XY stage 105 continuously moving in the X direction.

In the case of FIG. 2, the electron beam 200 passes through the opening 32 of the first shaping aperture 203, so that the beam is shaped into a rectangle. Then, the electron beam 200 passes through the variable-shaping opening 34 of the second shaping aperture 206, so that the beam is shaped into an isosceles right triangle in cross-section perpendicular to the axis of the beam. In the present embodiment, the first shaping deflector 220 adjusts the shape of a shot and the second shaping deflector 222 adjusts the size of the shot.

Figure 3:
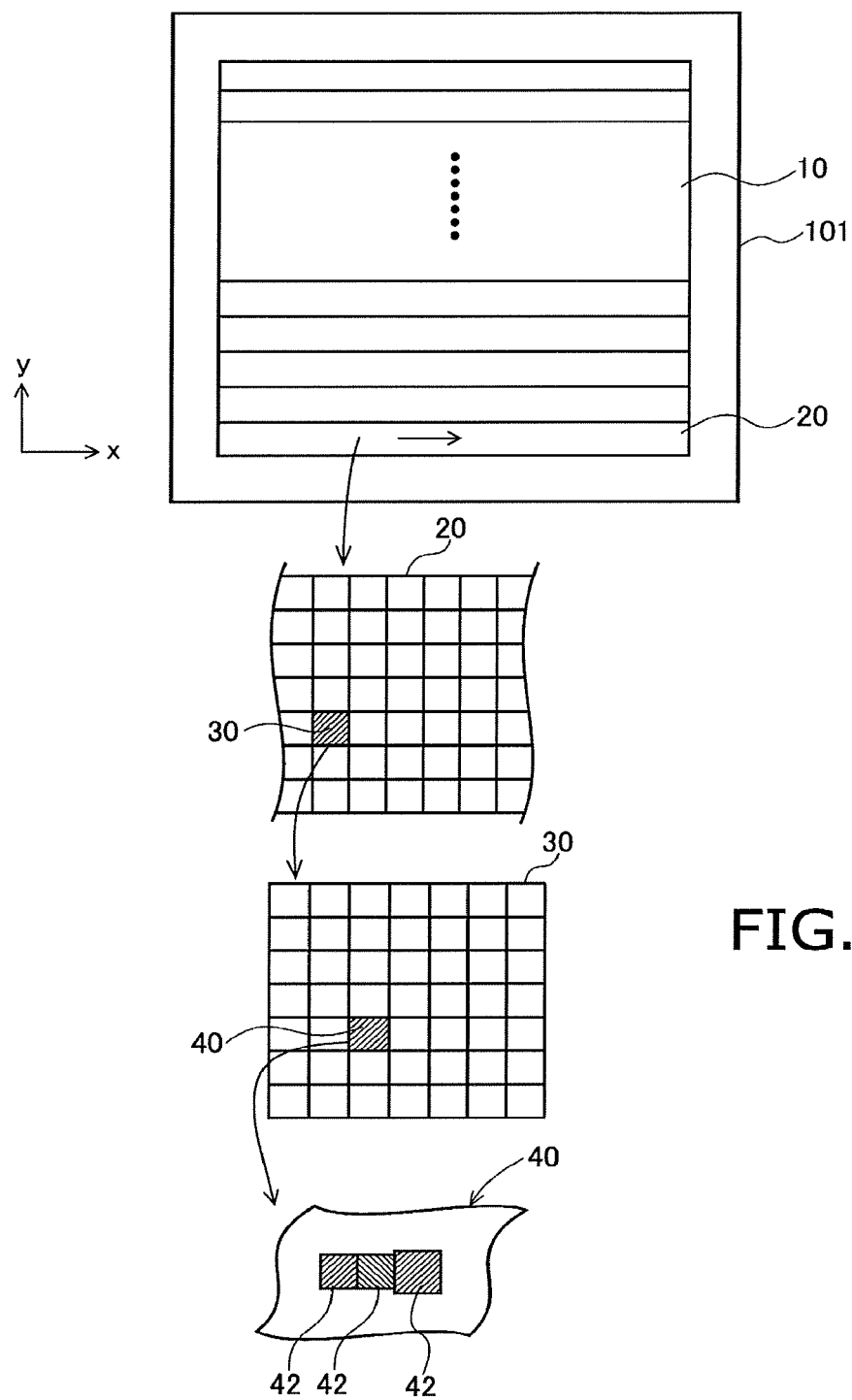
FIG. 3 is a schematic diagram explaining a writing area.

FIG. 3 is a schematic diagram explaining a writing area. Referring to FIG. 3, a writing area 10 of the substrate 101 is virtually divided into a plurality of stripe regions 20, which are strip-shaped parts having a width in which the main deflector 232 can perform deflection and are arranged in, for example, the y direction. Each stripe region 20 is virtually divided into a plurality of mesh-like sub-fields (SFs) 30 having a size in which the sub-deflector 230 can perform deflection. Each SF 30 is virtually divided into a plurality of mesh-like tertiary fields (TFs) 40 having a size in which the sub-sub-deflector 234 can perform deflection. A shot figure is written at each shot position 42 in each TF 40. It is desirable that the number of TFs in each SF be a number at which a writing operation is not delayed by thermal diffusion computation for the TFs. For example, each of the number of columns of TFs and the number of rows of TFs is preferably less than or equal to 10, more preferably less than or equal to 5.

To perform writing on the substrate 101 using the shaped electron beam 200, the main deflector 232 deflects the shaped electron beam 200 to a reference position in an SF 30. When the XY stage 105 is moving, the main deflector 232 deflects the electron beam 200 such that the beam follows the moving XY stage 105. The sub-deflector 230 deflects the shaped electron beam 200 from the reference position in the SF 30 to a reference position in a TF 40 in the SF 30. The sub-sub-deflector 234 deflects the electron beam 200, and the deflected electron beam 200 is applied to each position in the TF 40.

The write data processing unit 114 reads write data (pattern data) from the memory 140 and performs multi-stage data conversion on the write data to generate shot data specific to the apparatus. The shot data includes a figure type, a size, and a shot position for each shot. The corrected-position computing unit 112 reads a correction coefficient from the memory 142 and computes the amount of correction for correcting positional deviation of the electron beam 200 on the basis of the position and moving speed of the XY stage 105. The corrected-position computing unit 112 computes a corrected writing position based on the correction amount.

The deflection control circuit 120 receives the shot data and the corrected writing position from the control computer 110, mathematically calculates the amount of deflection for each of the blanker 212, the first shaping deflector 220, the second shaping deflector 222, the main deflector 232, the sub-deflector 230, and the sub-sub-deflector 234, and outputs a control signal to each of these deflectors. Consequently, a predetermined pattern is written at a desired position.

Correction coefficients to be stored in the memory 142 will now be described. In electron beam writing, various physical phenomena result in deviation of the trajectory of an electron beam, causing deviation of a writing position. The correction coefficients are used to correct positional deviation or errors resulting from the physical phenomena. A correction coefficient is defined for each physical phenomenon. In the present embodiment, a correction coefficient for field distortion, a correction coefficient for resist charging, a correction coefficient for an eddy current, and a correction coefficient for substrate flexure are obtained, and the correction coefficients for the four physical phenomena are stored in the memory 142.

The field distortion refers to distortion in shape of deflection fields (main fields, sub-fields, and tertiary fields) for the main deflector 232, the sub-deflector 230, and the sub-sub-deflector 234. Distortion in shape of deflection fields leads to deviation of a writing position.

The resist applied to the substrate 101 is an organic insulating layer. Some of electrons entered the resist accumulate in the resist and the surface of the resist (resist charging). An electrostatic force associated with the accumulation of electrons causes deviation of the trajectory of an electron beam, leading to deviation of a writing position.

To increase the resolution of an electron beam on the surface of the substrate 101, the objective lens 207 is brought close to the substrate 101. This results in "in-lens" arrangement in which the substrate 101 is exposed to the magnetic field of the lens. In the "in-lens" arrangement, the magnetic field of the objective lens 207 passes through the metal light-shielding layer of the substrate 101. Movement of the XY stage 105, on which the substrate 101 is placed, causes an eddy current in the substrate 101. A magnetic field generated by the eddy current causes deviation of the trajectory of the electron beam. A change in thickness of the metal light-shielding layer or a change in moving speed of the XY stage 105 results in a change in strength of the magnetic field generated by the eddy current.

The substrate 101 is supported by three supporting pins arranged on the XY stage 105. The substrate 101 flexes due to its own weight. If the substrate 101 flexes and the surface thereof is uneven, or not flat, a writing position is deviated.

In the present embodiment, a correction coefficient for correcting positional deviation resulting from one of the four physical phenomena including field distortion, resist charging, an eddy current, and substrate flexure is calculated so as not to be affected by the other three physical phenomena.

Resist charging can be prevented by, for example, applying a charge dissipation layer (CDL) to the resist on the substrate 101.

An eddy current can be prevented by stopping the XY stage 105 and performing static writing.

Central part of the substrate 101, for example, 3- to 4-cm square central part of the substrate 101, is less likely to flex and is substantially flat. Using the central part of the substrate 101 as a writing area can reduce or eliminate the effect of substrate flexure.

A method of calculating correction coefficients for the physical phenomena will now be described with reference to a flowchart of FIG. 4.

An evaluation pattern (first evaluation pattern) is statically written in central part of a substrate 101 having CDL applied to the resist (step S101). For example, the evaluation pattern includes a cross pattern. The CDL can be made of a known material.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation from a design value is computed, thus determining a first correction coefficient for correcting the positional deviation (step S102).

In writing of step S101, resist charging is prevented by coating the resist with the CDL. In addition, an eddy current is prevented by performing static writing. Additionally, the effect of substrate flexure is reduced or eliminated by writing the evaluation pattern in the central part of the substrate 101. Therefore, the first correction coefficient obtained in step S102 is a correction coefficient for correcting positional deviation associated with field distortion. The first correction coefficient is stored in the memory 142.

Then, an evaluation pattern (second evaluation pattern) is statically written in central part of another substrate 101 using the first correction coefficient (step S103). The resist is not coated with CDL.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation from the design value is computed, thus determining a second correction coefficient for correcting the positional deviation (step S104).

In writing of step S103, an eddy current is prevented by performing static writing. In addition, the effect of substrate flexure is reduced or eliminated by writing the evaluation pattern in the central part of the substrate 101. Additionally, since the first correction coefficient is used to correct the writing position for the evaluation pattern, positional deviation associated with field distortion is reduced or eliminated. Therefore, the second correction coefficient obtained in step S104 is a correction coefficient for correcting positional deviation associated with resist charging.

Then, an evaluation pattern (third evaluation pattern) is written in central part of another substrate 101 having CDL applied to the resist using the first correction coefficient while the XY stage is being moved (continuous writing) (step S105).

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus determining a third correction coefficient for correcting the positional deviation (step S106).

In writing of step S105, resist charging is prevented by coating the resist with CDL. In addition, the effect of substrate flexure is reduced or eliminated by writing the evaluation pattern in the central part of the substrate 101. Additionally, since the first correction coefficient is used to correct the writing position for the evaluation pattern, positional deviation associated with field distortion is reduced or eliminated. Therefore, the third correction coefficient obtained in step S106 is a correction coefficient for correcting positional deviation associated with an eddy current.

Then, an evaluation pattern (fourth evaluation pattern) is statically written on another substrate 101 having CDL applied to the resist using the first correction coefficient (step S107). This evaluation pattern is written not only in central part of the substrate 101 but also in as wide a range of a writable area as possible.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus determining a fourth correction coefficient for correcting the positional deviation (step S108).

In writing of step S107, resist charging is prevented by coating the resist with CDL. In addition, an eddy current is prevented by performing static writing. Additionally, since the first correction coefficient is used to correct the writing position for the evaluation pattern, positional deviation associated with field distortion is reduced or eliminated. Therefore, the fourth correction coefficient obtained in step S108 is a correction coefficient for correcting positional deviation associated with substrate flexure.

The first to fourth correction coefficients for the four physical phenomena including field distortion, resist charging, an eddy current, and substrate flexure are stored in the memory 142.

For actual writing on a product, the corrected-position computing unit 112 reads the first to fourth correction coefficients from the memory 142 and computes correction amounts for correcting positional deviation of the electron beam 200. The corrected-position computing unit 112 computes a corrected position by adding the correction amounts to design coordinates. The electron beam 200 is applied to the corrected position, thus writing a predetermined pattern.

In the present embodiment, the first to fourth correction coefficients are determined while the effects of the physical phenomena other than the physical phenomenon associated with a positional error or deviation to be corrected are being reduced or eliminated. The position is corrected using the first to fourth correction coefficients, thus improving writing positional accuracy.

Second Embodiment

Figure 5:
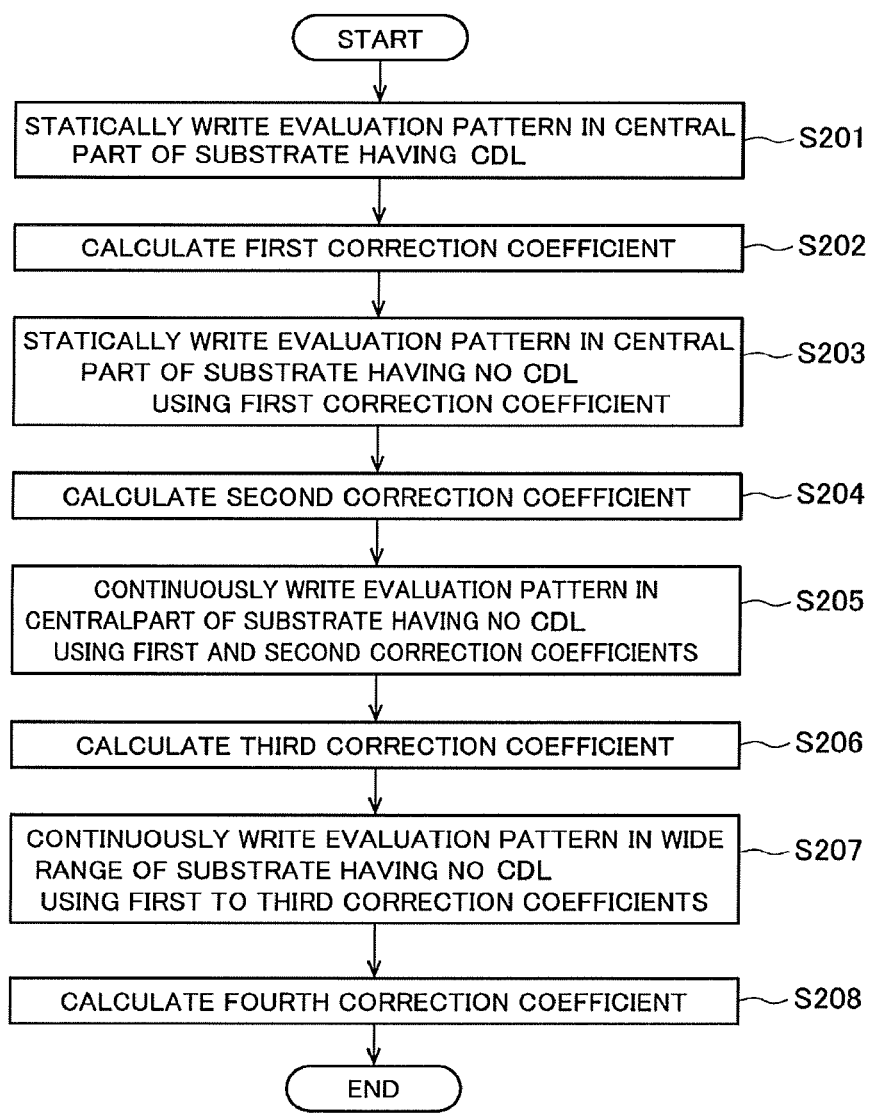
FIG. 5 is a flowchart explaining a method of calculating correction coefficients in accordance with a second embodiment.

In the above-described first embodiment, writing is performed under writing conditions where the physical phenomena other than the physical phenomenon associated with a positional error or deviation to be corrected are eliminated, and a plurality of correction coefficients for the physical phenomena are obtained. The correction coefficients may be obtained by sequentially using the calculated correction coefficients. A method of calculating the correction coefficients in accordance with a second embodiment will now be described with reference to a flowchart of FIG. 5.

Figure 4:
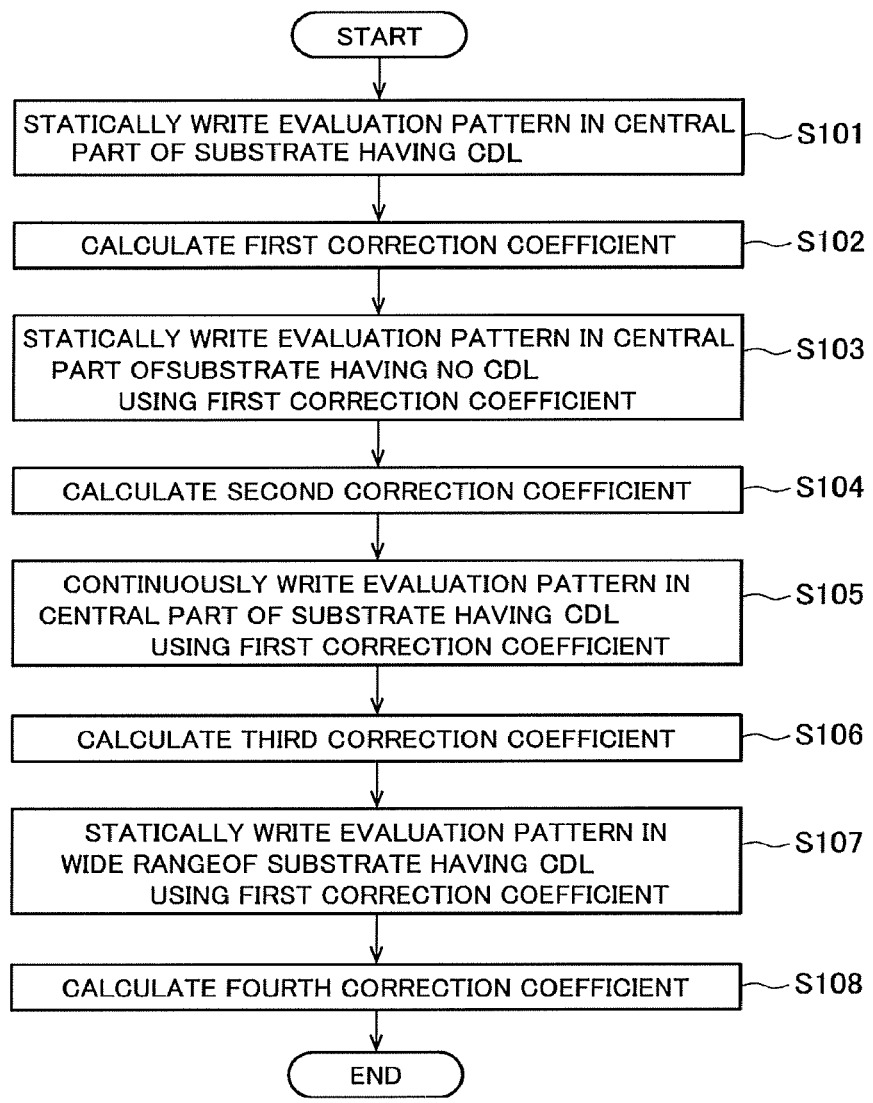
FIG. 4 is a flowchart explaining a method of calculating correction coefficients in accordance with the first embodiment.

Steps S201 to S204 of calculating the first and second correction coefficients are the same as steps S101 to S104 in FIG. 4. A description of steps S201 to S204 is omitted.

An evaluation pattern is written in central part of a substrate 101 using the first and second correction coefficients while the XY stage is being moved (continuous writing) (step S205). The resist is not coated with CDL.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus calculating a third correction coefficient for correcting the positional deviation (step S206). The third correction coefficient is a correction coefficient for correcting positional deviation associated with an eddy current.

Then, an evaluation pattern is written on another substrate 101 using the first to third correction coefficients while the XY stage is being moved (continuous writing) (step S207). The resist is not coated with CDL. The evaluation pattern is written in as wide a range of the writable area of the substrate 101 as possible.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus calculating a fourth correction coefficient for correcting the positional deviation (step S208). The fourth correction coefficient is a correction coefficient for correcting positional deviation associated with substrate flexure.

As described above, the calculated correction coefficients can be sequentially used to obtain the correction coefficients for correcting positional deviation or errors associated with physical phenomena.

In the present embodiment, it is preferred that writing in a small writing area (central part of the substrate) be performed prior to writing in a wide range of the writing area to calculate or update correction coefficients. In addition, it is preferred that static writing, in which writing is performed while the XY stage 105 is being stopped, be performed prior to continuous writing, in which writing is performed while the XY stage 105 is being moved, to calculate or update correction coefficients.

Third Embodiment

FIG. 6 is a flowchart explaining a method of determining correction coefficients for various substrate materials and writing conditions and performing writing on a product.

An electron beam is scanned over a reference mark disposed at a different position from a substrate placement area of the XY stage 105, electrons reflected from the reference mark are detected, and an optical system or tracking of the XY stage 105 is adjusted based on the result of scanning to eliminate distortion in shape of deflection fields (step S301). In this step, writing is not performed on a substrate 101. The writing apparatus can therefore be adjusted without being affected by substrate materials.

Then, an evaluation pattern is statically written in central part of a substrate 101 having CDL applied to the resist (step S302).

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus determining a first correction coefficient for correcting the positional deviation (step S303). The first correction coefficient is a correction coefficient for correcting positional deviation associated with field distortion that failed to be eliminated by adjusting the optical system in step S301.

If positional deviation associated with resist charging is to be corrected (Yes in step S304), an evaluation pattern is statically written in central part of another substrate 101 having no CDL using the first correction coefficient obtained in step S303 (step S305). A plurality of substrates 101 having different types of resist are prepared, and the evaluation pattern is written on each of the substrates 101.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus calculating a second correction coefficient for correcting the positional deviation (step S306). The second correction coefficient is a correction coefficient for correcting positional deviation associated with resist charging. The type of resist is a parameter.

If the correction of positional deviation associated with resist charging is not needed (No in step S304) because, for example, CDL is set to be used in writing on a product, CDL is applied to the substrate in the subsequent writing to prevent resist charging (step S307).

Then, an evaluation pattern is written in central part of another substrate 101 while the XY stage is being moved (continuous writing) (step S308). The effect of resist charging is eliminated by using the first and second correction coefficients or by applying CDL to the resist and using the first correction coefficient. A plurality of substrates 101 including different metal light-shielding layers made of different materials are prepared. The evaluation pattern is written on each of the substrates 101 while the moving speed of the XY stage 105 is being changed for each substrate.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus calculating a third correction coefficient for correcting the positional deviation (step S309). The third correction coefficient is a correction coefficient for correcting positional deviation associated with an eddy current. The material of the metal light-shielding layer and the moving speed of the XY stage 105 are parameters. For example, the third correction coefficient is expressed by an approximate expression that approximates the amount of positional deviation (correction amount) using the moving speed of the stage as a factor.

Then, while the XY stage is being moved, an evaluation pattern is written on another substrate 101 using the first to third correction coefficients or on another substrate 101 having CDL applied to the resist using the first and third correction coefficients (continuous writing) (step S310). The evaluation pattern is written in as wide a range of the writable area of the substrate 101 as possible.

After the evaluation pattern is written, development is performed to form a resist pattern. Then, the metal light-shielding layer is etched by using the resist pattern as a mask, the resist is removed, and cleaning is performed, thus forming a light-shielding-layer pattern. The position of the light-shielding-layer pattern is measured and the amount of positional deviation is computed, thus calculating a fourth correction coefficient for correcting the positional deviation (step S311). The fourth correction coefficient is a correction coefficient for correcting positional deviation associated with substrate flexure.

When an electron beam is applied to the substrate 101 in the electron beam writing apparatus, reflected electrons occur. The reflected electrons may strike the optical system and the detector in the electron beam writing apparatus, causing a charge-up phenomenon. In such a case, a new electric field is generated from a place affected by the charge-up phenomenon. Furthermore, the material of the resist irradiated with the electron beam may be scattered, and the deflectors may be contaminated with the scattered resist material. These factors may cause the trajectory of the electron beam to change with time, causing the beam to drift such that a writing position is deviated from a desired position. If beam drift occurs (No in step S312), the position of the reference mark on the stage is detected and the amount of drift is properly measured, thus correcting the writing position (step S313).

Information about a substrate, serving as a product, and writing conditions are registered in the writing apparatus (step S314). In writing on the product (step S315), the correction coefficients for the material of the metal light-shielding layer included in the substrate 101, serving as a writing target, the type of resist, and the moving speed of the stage in the writing operation are read from the memory 142, a writing position is corrected using the correction coefficients, and a predetermined pattern is written. The positional deviation or errors resulting from the physical phenomena can be corrected, thus improving the writing positional accuracy.

Although the configuration using an electron beam has been described in the above embodiments, the present invention is not limited to such an example. The present invention is applicable to a configuration using another charged particle beam, such as an ion beam. Although the single-beam writing apparatus has been described in the above embodiments, a multi-beam writing apparatus may be used.

While certain embodiments have been described, these embodiments have been presented by way of example only, and are not intended to limit the scope of the inventions. Indeed, the novel methods and systems described herein may be embodied in a variety of other forms, furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method for writing a pattern on a substrate by irradiating the substrate with a charged particle beam, the substrate being placed on a movable stage and coated with resist, the method comprising:

writing a first evaluation pattern in a writing area located in central part of a first substrate having Charge Dissipation Layer (CDL) on resist while stopping the stage to calculate, based on a position of the written first evaluation pattern, a first correction coefficient for correcting a positional error;

correcting a writing position in a writing area located in central part of a second substrate having no CDL on resist using the first correction coefficient and writing a second evaluation pattern in the writing area of the second substrate while stopping the stage to calculate, based on a position of the written second evaluation pattern, a second correction coefficient for correcting a positional error;

correcting a writing position in a writing area located in central part of a third substrate having CDL on resist using the first correction coefficient and writing a third evaluation pattern in the writing area of the third substrate while moving the stage to calculate, based on a position of the written third evaluation pattern, a third correction coefficient for correcting a positional error;

correcting a writing position in a writing area larger than central part of a fourth substrate having CDL on resist using the first correction coefficient and writing a fourth evaluation pattern in the writing area of the fourth substrate while stopping the stage to calculate, based on a position of the written fourth evaluation pattern, a fourth correction coefficient for correcting a positional error; and computing a corrected position, at which positional deviation of the charged particle beam is corrected, on a surface of the substrate using the first, second, third, and fourth correction coefficients and irradiating the corrected position with the charged particle beam to write a predetermined pattern.

2. The method according to claim 1, further comprising, before calculating the first correction coefficient:

scanning the charged particle beam over a reference mark disposed on the stage and adjusting, based on a scanning result, a shape of a deflection field for a deflector that deflects the charged particle beam.

3. The method according to claim 1, wherein the second evaluation pattern is written on each of a plurality of the second substrates coated with different types of resist to calculate the second correction coefficient for each type of resist.

4. The method according to claim 1, wherein the third evaluation pattern is written on each of a plurality of the third substrates including different types of metal light-shielding layer underlying the resist while a moving speed of the stage is being changed for each third substrate to calculate the third correction coefficient for each type of metal light-shielding layer.

5. A charged particle beam writing method for writing a pattern on a substrate placed on a movable stage and coated with resist by irradiating the substrate with a charged particle beam, the method comprising:

writing a first evaluation pattern in a writing area located in central part of a first substrate having CDL on resist while stopping the stage to calculate, based on a position of the written first evaluation pattern, a first correction coefficient for correcting a positional error;

correcting a writing position in a writing area located in central part of a second substrate having no CDL on resist using the first correction coefficient and writing a second evaluation pattern in the writing area of the second substrate while stopping the stage to calculate, based on a position of the written second evaluation pattern, a second correction coefficient for correcting a positional error;

correcting a writing position in a writing area located in central part of a third substrate having no CDL on resist using the first and second correction coefficients and writing a third evaluation pattern in the writing area of the third substrate while moving the stage to calculate, based on a position of the written third evaluation pattern, a third correction coefficient for correcting a positional error;

correcting a writing position in a writing area larger than central part of a fourth substrate having no CDL on resist using the first, second, and third correction coefficients and writing a fourth evaluation pattern in the writing area of the fourth substrate while moving the stage to calculate, based on a position of the written fourth evaluation pattern, a fourth correction coefficient for correcting a positional error; and computing a corrected position, at which positional deviation of the charged particle beam is corrected, on a surface of the substrate using the first, second, third, and fourth correction coefficients and irradiating the corrected position with the charged particle beam to write a predetermined pattern.

6. The method according to claim 5, further comprising, before calculating the first correction coefficient:

scanning the charged particle beam over a reference mark disposed on the stage and adjusting, based on a scanning result, a shape of a deflection field for a deflector that deflects the charged particle beam.

7. The method according to claim 5, wherein the second evaluation pattern is written on each of a plurality of the second substrates coated with different types of resist to calculate the second correction coefficient for each type of resist.

8. The method according to claim 5, wherein the third evaluation pattern is written on each of a plurality of the third substrates including different types of metal light-shielding layer underlying the resist while a moving speed of the stage is being changed for each third substrate to calculate the third correction coefficient for each type of metal light-shielding layer.

* * * * *